United States Patent
Sakurai et al.

[11] Patent Number: 5,932,339
[45] Date of Patent: Aug. 3, 1999

[54] ANISOTROPICALLY ELECTRICITY CONDUCTIVE FILM COMPRISING THERMOSETTING ADHESIVE AGENT AND ELECTRICALLY CONDUCTIVE PARTICLES

[75] Inventors: Ryou Sakurai; Tasuku Saito; Hidefumi Kotsubo, all of Tokyo, Japan

[73] Assignee: Bridgestone Corporation, Tokyo, Japan

[21] Appl. No.: 08/701,690

[22] Filed: Aug. 22, 1996

[30] Foreign Application Priority Data

Aug. 22, 1995 [JP] Japan .................................. 7-213628

[51] Int. Cl.$^6$ ....................................................... B32B 5/16
[52] U.S. Cl. ........................ 428/323; 174/126.2; 174/257; 174/259; 428/332; 428/523
[58] Field of Search ..................... 428/323, 332, 428/523; 174/126.2, 257, 259

[56] References Cited

U.S. PATENT DOCUMENTS

| | | | |
|---|---|---|---|
| 4,731,282 | 3/1988 | Tsukagoshi et al. | 428/220 |
| 4,734,452 | 3/1988 | Hashimoto et al. | 524/533 |
| 4,740,657 | 4/1988 | Tsukagoshi et al. | 174/88 |
| 4,775,500 | 10/1988 | Funakoshi et al. | 264/461 |
| 5,001,541 | 3/1991 | Tsukagoshi et al. | 357/68 |
| 5,120,665 | 6/1992 | Tsukagoshi et al. | 437/8 |

*Primary Examiner*—Hoa T. Le
*Attorney, Agent, or Firm*—Fish & Richardson P.C.

[57] ABSTRACT

The present invention relates to an anisotropically electricity-conductive film obtainable by dispersing in an adhesive agent electrically conductive particles, the adhesive agent being a curable adhesive agent comprising as a major component at least one polymer selected from the group consisting of an ethylene-vinyl acetate copolymer; a copolymer of ethylene, vinyl acetate and an acrylate and/or methacrylate monomer; a copolymer of ethylene, vinyl acetate and maleic acid and/or maleic anhydride; a copolymer of ethylene, an acrylate and/or methacrylate monomer and maleic acid and/or maleic anhydride; and an ionomer resin wherein molecules of an ethylene-methacrylic acid copolymer are linked with each other through a metal ion.

16 Claims, No Drawings

ANISOTROPICALLY ELECTRICITY CONDUCTIVE FILM COMPRISING THERMOSETTING ADHESIVE AGENT AND ELECTRICALLY CONDUCTIVE PARTICLES

BACKGROUND OF THE INVENTION

1. Field of the Invention

The present invention relates to an anisotropically electricity-conductive film having electric conductivity only in the direction of thickness, which is used for the purpose of connecting two circuits opposite to each other by locating the film between these circuits and pressurizing and heating it to thereby allow electrically conductive particles to spread between the circuits, as well as for the purpose of bonding and fixing the circuits by means of an adhesive agent forming the film.

2. Description of the Prior Art

An anisotropically electricity-conductive film is used to form an anisotropically electricity-conductive layer between various terminals and to thereby bond the terminals and, at the same time, electrically connect them. For example, such a film is used to connect a flexible printed circuit board (FPC) or TAB with an ITO terminal formed on a glass substrate in a liquid crystal panel.

Generally, anisotropically electricity-conductive films are composed of an epoxy or phenol resin, a curing agent and electrically conductive particles. Among them, films of one-pack type and thermosetting type have prevailed due to convenience in use or the like. Further, in order to achieve stable bonding reliability even under high temperature and high humidity, improvement of the bonding strength of such a film has been attempted by various methods.

However, conventional anisotropically electricity-conductive films using an epoxy or phenol resin have been low in tackiness and bad in workability.

OBJECTS AND SUMMARY OF THE INVENTION

It is an object of the invention to provide an anisotropically electricity-conductive film which is high in tackiness and yet good in workability.

The anisotropically electricity-conductive film of the present invention is a film obtainable by dispersing in an adhesive agent electrically conductive particles, the adhesive agent being a curable adhesive agent comprising as a major component at least one polymer selected from the group consisting of an ethylene-vinyl acetate copolymer; a copolymer of ethylene, vinyl acetate and an acrylate and/or methacrylate monomer; a copolymer of ethylene, vinyl acetate and maleic acid and/or maleic anhydride; a copolymer of ethylene, an acrylate and/or methacrylate monomer and maleic acid and/or maleic anhydride; and an ionomer resin wherein molecules of an ethylene-methacrylic acid copolymer are linked with each other through a metal ion.

The anisotropically electricity-conductive film of the invention is obtained by adding to the polymer an organic peroxide and/or a photosensitizer and a silane coupling agent and, further, an epoxy group-containing compound together with electrically conductive particles and shaping the resultant mixture into a thin layer. Upon formation of a crosslinked structure at the time of curing of this film, high adhesive property as well as excellent durability and thermal resistance are achieved.

When an ethylene-vinyl acetate copolymer is used as the polymer, the content of vinyl acetate in the copolymer is preferably 10–50% by weight, more preferably 15–45% by weight. If the vinyl acetate content is less than 10% by weight, a sufficient degree of crosslinking cannot be obtained when a film is crosslinked/cured at a high temperature. On the other hand, if this content is more than 50% by weight, the softening point of a resin becomes low. This makes it difficult to store the resultant film, raising a practical problem.

When a copolymer of ethylene, vinyl acetate and an acrylate and/or methacrylate monomer is used as the polymer, the content of vinyl acetate in the copolymer is preferably 10–50% by weight, more preferably 14–45% by weight. If the vinyl acetate content is less than 10% by weight, a sufficient degree of crosslinking cannot be obtained when a film is crosslinked/cured at a high temperature. On the other hand, if this content is more than 50% by weight, the softening point of a resin becomes low. This makes it difficult to store the resultant film, raising a practical problem. Further, the acrylate and/or methacrylate monomer content of the copolymer is preferably 0.01–10% by weight, more preferably 0.05–5% by weight. If this monomer content is less than 0.01% by weight, the improved effect in adhesive power may decrease. On the other hand, if the monomer content is more than 10% by weight, processability may decrease.

An acrylate and/or methacrylate monomer useful for the above purpose is a monomer selected from acrylic or methacrylic esters and is preferably an ester formed from acrylic or methacrylic acid and an aliphatic alcohol with 1–20, especially 1–18 carbon atoms that may be either unsubstituted one or substituted one with a substituent such as an epoxy group. For example, methyl acrylate, methyl methacrylate, ethyl acrylate, ethyl methacrylate, glycidyl methacrylate and the like may be enumerated.

When a copolymer of ethylene, vinyl acetate and maleic acid and/or maleic anhydride is used as the polymer, the content of vinyl acetate in the copolymer is preferably 10–50% by weight, more preferably 14–45% by weight. If the vinyl acetate content is less than 10% by weight, a sufficient degree of crosslinking cannot be obtained when a film is crosslinked/cured at a high temperature. On the other hand, if this content is more than 50% by weight, the intensity and durability of the adhesive layer tend to decrease remarkably. Further, the maleic acid and/or maleic anhydride content of the copolymer is preferably 0.01–10% by weight, more preferably 0.05–5% by weight. If this content is less than 0.01% by weight, the improved effect in adhesive power may decrease. On the other hand, if this content is more than 10% by weight, the processability may decrease.

When a copolymer of ethylene, one or both of an acrylate monomer and a methacrylate monomer, and maleic acid one or both of and maleic anhydride is used as the polymer, the content of the acrylate monomer in the copolymer is preferably 10–50% by weight, more preferably 14–45% by weight. If the acrylate monomer content is less than 10% by weight, a sufficient degree of crosslinking cannot be obtained when a film is crosslinked/cured at a high temperature. On the other hand, if this content is more than 50% by weight, the intensity and durability of the adhesive layer tend to decrease remarkably. Further, the maleic acid and/or maleic anhydride content of the copolymer is preferably 0.01–10% by weight, more preferably 0.05–5% by weight. If this content is less than 0.01% by weight, the improved effect in adhesive power may decrease. On the other hand, if this content is more than 10% by weight, the processability may decrease.

As an acrylate and/or methacrylate monomer useful for the above purpose, monomers similar to those described above may be enumerated.

When an ionomer resin wherein molecules of an ethylene-methacrylic acid copolymer are linked with each other through a metal ion (hereinafter referred to as the "ethylene-methacrylic acid ionomer resin") is used as the polymer, the methacrylic acid content of this resin is preferably 1–30% by weight, more preferably 5–25% by weight. If the methacrylic acid content is less than 1% by weight, the effect of ionic crosslinking may decrease to thereby lower the adhesive power. On the other hand, if this content is more than 30% by weight, a remarkable decrease in the processability may occur.

As a metal ion which may be used in this ethylene-methacrylic acid ionomer resin, metal cations of sodium, zinc, magnesium, lithium and the like may be enumerated. The degree of ionization by the metal ion is preferably 5–80%, more preferably 7–70%. If the degree of ionization is less than 5%, the transparency may remarkably decrease. On the other hand, if the degree exceeds 80%, a remarkable decrease in the processability may occur.

In order to cure the anisotropically electricity-conductive film of the invention, an organic peroxide and/or photosensitizer may be used. When the curable adhesive agent is a thermosetting adhesive agent, usually an organic peroxide is used. When the curable adhesive agent is a photo-setting adhesive agent, usually a photosensitizer is used.

As an organic peroxide added to cure the anisotropically electricity-conductive film of the invention, any organic peroxide may be used as long as it decomposes at a temperature of 70° C. or above to generate radicals. Preferable is an organic peroxide having a decomposition temperature of 50° C. or above at the half-life of 10 hours. An appropriate organic peroxide is selected considering the temperature in film-shaping, preparation conditions, curing (laminating) temperature, thermal resistance of the target to which the film is adhered and the storage stability of the film.

Specific examples of organic peroxides which may be used in the invention include 2,5-dimethylhexane-2,5-dihydroperoxide, 2,5-dimethyl-2,5-di(t-butylperoxy) hexyne-3, di-t-butyl peroxide, t-butylcumyl peroxide, 2,5-dimethyl-2,5-di(t-butylperoxy)hexane, dicumyl peroxide, α, α'-bis(t-butylperoxyisopropyl)benzene, n-butyl-4,4'-bis(t-butylperoxy)valerate, 1,1-bis(t-butylperoxy)cyclohexane, 1,1-bis(t-butylperoxy)-3,3,5-trimethylcyclohexane, t-butyl peroxybenzoate, benzoyl peroxide, t-butyl peroxyacetate, methyl ethyl ketone peroxide, 2,5-dimethylhexyl-2,5-bisperoxy-benzoate, butyl hydroperoxide, p-menthane hydroperoxide, p-chlorobenzoyl peroxide, hydroxyheptyl peroxide, chlorohexanone peroxide, octanoyl peroxide, decanoyl peroxide, lauroyl peroxide, cumyl peroxyoctoate, succinic acid peroxide, acetyl peroxide, t-butylperoxy(2-ethylhexanoate), m-toluoyl peroxide, benzoyl peroxide, t-butyl peroxyisobutyrate and 2,4-dichlorobenzoyl peroxide. At least one of these organic peroxides may be used alone or some of them may be used in combination. Usually, 0.1–10 weight parts of an organic peroxide(s) is(are) added to 100 weight parts of the polymer described above.

As a photosensitizer (photopolymerization initiator) added to cure the anisotropically electricity-conductive film of the invention, preferably a radical photopolymerization initiator may be used. Among radical photopolymerization initiators, benzophenone, methyl o-benzoylbenzoate, 4-benzoyl-4'-methyldiphenyl sulfide, isopropyl-thioxanthone, diethylthioxanthone, ethyl 4-(diethylamino) benzoate and the like may be used as a hydrogen abstraction type initiator. Further, as an intramolecular cleavage type initiator, benzoin ether, benzoyl propyl ether and benzyl dimethyl ketal may be used ; as an α-hydroxyalkylphenone type initiator, 2-hydroxy-2-methyl-1-phenylpropane-1-one, 1-hydroxycyclohexyl phenyl ketone, alkylphenyl glyoxylate and diethoxyacetophenone may be used; as an α-aminoalkylphenone type initiator, 2-methyl-1-[4-(methylthio)phenyl]-2-morpholinopropane-1 and 2-benzyl-2-dimethylamino-1-(4-morpholinophenyl)butanone-1 may be used; and acylphosphine oxide may also be used. At least one of these photosensitizers may be used alone or some of them may be used in combination. Usually, 0.1–10 weight parts of a photosensitizer(s) is(are) added to 100 weight parts of the polymer described above.

As a silane coupling agent which is added as an adhesion promoter for the anisotropically electricity-conductive film of the Invention, specific examples include vinyltriethoxysilane, vinyltris(β-methoxyethoxy)silane, γ-methacryloxypropyltrimethoxysilane, vinyltriacetoxysilane, γglycidoxypropyltrimethoxysilane, γ-glycidoxypropyltriethoxysilane, β-(3,4-epoxycyclohexyl) ethyltrimethoxysilane, vinyltrichlorosilane, γ-mercaptopropyltrimethoxysilane, γ-aminopropyltriethoxysilane and N-β-(aminoethyl)-γ-aminopropyltrimethoxysilane. One of these compounds or a mixture of two or more of them may be used. Usually, it is sufficient to add 0.01–5 weight parts of such a silane coupling agent(s) to 100 weight parts of the polymer described above.

As an epoxy group containing compound which is added as an adhesion promoter for the anisotropically electricity-conductive film of the invention, specific examples include triglycidyltris(2-hydroxyethyl)isocyanurate, neopentyl glycol diglycidyl ether, 1,6-hexanediol diglycidyl ether, allylglycidyl ether, 2-ethylhexyl glycidyl ether, phenylglycidyl ether, phenol(EO)$_5$ glycidyl ether, p-t-butylphenylglycidyl ether, diglycidyl azipate, diglycidyl phthalate, glycidyl methacrylate and butylglycidyl ether. Alternatively, a similar effect can be obtained by making an epoxy group containing polymer into an alloy. One of these epoxy group containing compounds or a mixture of two or more of them may be used. Usually, it is sufficient to add 0.1–20 weight parts of such a compound(s) to 100 weight parts of the polymer described above.

For improvement and adjustment of the physical properties (such as mechanical strength, adhesive property, optical property, thermal resistance, resistance against humidity and heat, weather resistance, crosslinking rate) of the anisotropically electricity-conductive film of the invention, a compound containing an acryloyl group, methacryloyl group or allyl group may be added in the present invention.

As a compound which may be used for the above purpose, an acrylic acid- or methacrylic acid-derivative (e.g., an ester or amide of such acids) is most commonly used. As an ester residue, in addition to alkyl groups such as methyl, ethyl, dodecyl, stearyl and lauryl, a cyclohexyl group, tetrahydro-furfuryl group, aminoethyl group, 2-hydroxyethyl group, 3-hydroxypropyl group, 3-chloro-2-hydroxypropyl group and the like may be enumerated. Further, an ester derived from the above acid and a multifunctional alcohol, such as ethylene glycol, triethylene glycol, polypropylene glycol, polyethylene glycol, trimethylol propane, pentaerythritol, may be used similarly. As an amide for the above purpose, diacetonacrylamide is representative. As a multifunctional crosslinking aid, an acrylate or methacrylate of trimethylol propane, pentaerythritol, glycerol and the like may be used. As a compound containing an allyl group, triallyl cyanurate, triallyl isocyanurate, diallyl phthalate, diallyl isophthalate and diallyl maleate may be used. One of these compounds or a mixture of two or more of them is added usually in a ratio of 0.1–50 weight parts, preferably 0.5–30 weight parts, to 100 weight parts of the polymer described above. Addition of more than 50 weight parts of such a compound(s) may reduce the workability at the time of preparation of the adhesive agent and worsen the film-shaping property.

Further, in the anisotropically electricity-conductive film of the invention, there may be added to the adhesive agent a hydrocarbon resin in order to improve the processability in laminating or the like. In such a case, a hydrocarbon resin to be added may be either a natural resin or a synthetic resin. As a natural resin, rosin, derivatives thereof and terpene resins may be used preferably. Specific examples of rosin include gum resins, tall oil resins and wood resins. Specific examples of rosin derivatives include those which are obtained by hydrogenating, heterogenizing, polymerizing, esterifying rosin or making rosin into a metal salt. As a terpene resin, terpene phenol resins may also be used as well as terpene resins such as α-pinene and β-pinene. In addition, other natural resins which may be used for the above purpose include dammar, copal and shellac. On the other hand, as a synthetic resin, petroleum resins, phenol type resins and xylene type resins may be used preferably. Specific examples of petroleum resins which may be used for the above purpose include aliphatic type petroleum resins, aromatic type petroleum resins, alicyclic type petroleum resins, copolymerized petroleum resins, hydrogenated petroleum resins, pure monomer type petroleum resins and coumarone-indene resins. Specific examples of phenol type resins include alkyl phenol resins and denatured phenol resins. Specific examples of xylene type resins include xylene resins and modified xylene resins.

The amount of addition of the hydrocarbon resin described above may be appropriately selected. Preferably 1–200 weight parts, more preferably 5–150 weight parts of the resin is added to 100 weight parts of the polymer.

In addition to the additives so far described, an anti-aging agent, UV absorbant, dye, processing aid or the like may be used in a range which would not affect the object of the invention.

As electrically conductive particles used in the invention, various kinds of particles may be used as long as they are electrically good conductors. Specific examples of electrically conductive particles include a metal powder such as copper, silver, nickel, and a resin or ceramic powder coated with such a metal. Further, the shape of such particles is not particularly limited. These particles may take any shape such as flakes, twigs, granules and pellets.

For obtaining the anisotropically electricity-conductive film of the invention, it is necessary to add to the polymer, which is the major component, the above-mentioned crosslinking agent generating radicals through decomposition by heat or light (an organic peroxide and/or a photosensitizer), (and the crosslinking aid, if necessary), the silane coupling agent and the epoxy group containing compound.

The anisotropically electricity-conductive film of the invention may be shaped into a specific form by a film-shaping method such as the calender roll method, T-die extrusion, inflation or the like after the polymer has been mixed homogeneously with the above additives and kneaded with an extruder, roll or the like. During this shaping, an embossing process may be carried out in order to prevent blocking and to facilitate the pressure bonding of the film to a target. For laminating the thus obtained film on a target, such as polyimide or copper foil, conventional methods such as lamination with a heat press, direct lamination with an extruder or calender and the heating & pressuring method with a film laminater may be used.

Alternatively, each component of the film may be homogeneously dissolved in a solvent which would not affect a separator, coated on the polyimide evenly and then thermoset or photo-set after a target such as polyimide or copper foil has been tentatively pressure-bonded.

With respect to curing conditions for the anisotropically electricity-conductive film of the invention, curing is performed usually at 70–170° C., preferably at 70–150° C., for usually 10 seconds to 120 minutes, preferably 20 seconds to 60 minutes in the case of thermosetting, though these conditions depend on the kind of an organic peroxide used.

On the other hand, in the case of photo-setting using a photosensitizer, a number of light sources may be used which emit rays in the ultraviolet to visible ranges. For example, an ultrahigh pressure-, high pressure- or low pressure-mercury lamp, chemical lamp, xenon lamp, halogen lamp, mercury halogen lamp, carbon arc lamp, incandescent electric lamp, laser beams and the like may be used. The time of radiation is from several ten seconds to several ten minutes, though it varies depending of the kind of the lamp and the intensity of the light source used.

In order to promote setting, the laminated film may be heated to 40–120° C. in advance and then irradiated with UV rays.

The anisotropically electricity-conductive film of the invention is obtained by adding to the polymer electrically conductive particles together with an organic peroxide and/or a photosensitizer, a silane coupling agent and further an epoxy group containing compound and then shaping the resultant mixture into a film.

Since the major component of the adhesive agent in the anisotropically electricity-conductive film of the invention is the polymer, the film has the following properties:

(1) It is good in repairability.
(2) It is good in transparency.
(3) It exhibits a more stable and higher adhesive property than conventional films.
(4) It is good in phototransparency and workability at the time of positioning of electrodes, since this film is prepared from a transparent polymer.
(5) While conventional films of epoxy type have required heating to 150° C. or above, the film of the invention can be cured and adhered at 100° C. or below. Since the film of the invention can also be made UV curing, curing and adhesion at a still lower temperature can be achieved.
(6) Conventional anisotropically electricity-conductive films of epoxy or phenol type lack tackiness and, thus, it is difficult to temporarily fasten the film on an electrode with a tacky adhesive power and the film is easily peeled. They are bad in workability. On the other hand, according to the invention, the film is good in workability in the temporary fastening since it has a high and tacky adhesive power.

In the present invention, the amount of electrically conductive particles added is preferably 0.1–15% by volume in relation to the polymer and the particle size of these particles is preferably 0.1–100 μm. By thus specifying the amount and particle size of electrically conductive particles, it is possible to prevent aggregation of these particles between two circuits adjacent to each other and the resultant short-circuit.

DESCRIPTION OF THE PREFERRED EMBODIMENTS

The invention will be described more specifically below with reference to the following Examples and Comparative Examples, which should not be construed as limiting the scope of the invention.

EXAMPLE 1

A toluene (15% by weight) solution of an ethylene-vinyl acetate copolymer (Ultrasen 710 manufactured by Tosoh Corp.; vinyl acetate content: 28% by weight) was prepared. To 100 weight parts of the ethylene-vinyl acetate copolymer, 0.5 weight part of 1,1-bis(t-butylperoxy)-3,3,5-trimethylcyclohexane, 2.0 weight parts of glycidyl methacrylate and 0.5 weight part of γ-methacryloxypropyltrimethoxysilane were added and mixed sufficiently. Further, truly spherical copper particles manufactured by Fukuda Metal Foil & Powder Industry (particle size: 3.8 μm) was added and mixed in a ratio of 4% by volume in relation to the ethylene-vinyl acetate copolymer. Then, the resultant mixture was coated on poly(ethylene terephthalate), a separator, with a bar coater to thereby obtain a film 5 mm in width and 15 μm in thickness.

EXAMPLE 2

A toluene (15% by weight) solution of an ethylene-vinyl acetate copolymer (Ultrasen 750 manufactured by Tosoh Corp.; vinyl acetate content: 32% by weight) was prepared. To 100 weight parts of the ethylene-vinyl acetate copolymer, 4.0 weight parts of benzoyl peroxide, 4.0 weight parts of glycidyl methacrylate and 0.5 weight part of γ-methacryloxypropyltrimethoxysilane were added and mixed sufficiently. Further, truly spherical copper particles manufactured by Fukuda Metal Foil & Powder Industry (particle size: 7.6 μm) was added and mixed in a ratio of 4% by volume in relation to the ethylene-vinyl acetate copolymer. Then, the resultant mixture was coated on poly(ethylene terephthalate), a separator, with a bar coater to thereby obtain a film 5 mm in width and 15 μm in thickness.

Comparative Example 1

A toluene (15% by weight) solution of an epoxy resin was prepared. To this solution, truly spherical copper particles manufactured by Fukuda Metal Foil & Powder Industry (particle size: 3.8 μm) was added and mixed in a ratio of 4% by volume in relation to the epoxy resin. The resultant mixture was coated on poly(ethylene terephthalate), a separator, with a bar coater to thereby obtain a film 5 mm in width and 15 μm in thickness.

Comparative Example 2

A toluene (15% by weight) solution of a phenol resin was prepared. To this solution, truly spherical nickel particles manufactured by Fukuda Metal Foil & Powder Industry (particle size: 7.6 μm) was added and mixed in a ratio of 4% by volume in relation to the phenol resin. The resultant mixture was coated on poly(ethylene terephthalate), a separator, with a bar coater to thereby obtain a film 5 mm in width and 15 μm in thickness.

Each of the above samples was used to bond a flexible printed circuit board with a clear electrode glass. First, the separator was peeled off from the film and the positioning was carried out with a monitor. Then, the film was bonded by heating and pressing at 160° C. for 30 seconds. Continuity resistance between the flexible printed circuit board and the clear electrode glass and insulation resistance in the horizontal direction between them were measured. The results are shown below.

Example 1

Properties immediately after adhesion
  Continuity resistance: 0.5 Ω or less
  Insulation resistance: $10^9$ Ω or more
  Adhesive power: 3.1 kg/inch
Measurement of changes with passage of time (80° C./after 500 hr)
  Continuity resistance: 1.0 Ω or less
  Insulation resistance: $10^9$ Ω or more
  Adhesive power: 3.1 kg/inch

Example 2

Properties immediately after adhesion
  Continuity resistance: 0.5 Ω or less
  Insulation resistance: $10^9$ Ω or more
  Adhesive power: 2.8 kg/inch
Measurement of changes with passage of time (80° C./after 500 hr)
  Continuity resistance: 0.8 Ω or less
  Insulation resistance: $10^9$ Ω or more
  Adhesive power: 2.8 kg/inch

Comparative Example 1

Properties immediately after adhesion
  Continuity resistance: 0.5 Ω or less
  Insulation resistance: $10^9$ Ω or more
  Adhesive power: 0.2 kg/inch
Measurement of changes with passage of time (80° C./after 500 hr)
  Continuity resistance: 250 Ω or more
  Insulation resistance: $10^9$ Ω or more
  Adhesive power: 0.1 kg/inch

Comparative Example 2

Properties immediately after adhesion
  Continuity resistance: 0.5 Ω or less
  Insulation resistance: $10^9$ Ω or more
  Adhesive power: 0.3 kg/inch
Measurement of changes with passage of time (80° C./after 500 hr)
  Continuity resistance: 320 Ω or more
  Insulation resistance: $10^9$ Ω or more
  Adhesive power: 0.1 kg/inch

EXAMPLES 3–12

Based on the method described in Example 1, films 5 mm in width and 15 μm in thickness were prepared using the components shown in Tables 1 to 3 in the ratios shown in Tables 1 to 3. The results are summarized in Tables 1 to 3.

TABLE 1

| | | Example No. | | | |
|---|---|---|---|---|---|
| | | 1 | 2 | 3 | 4 |
| major component | kind | ethylene-vinyl acetate copolymer (EVA) (Ultrasen*5 manufactured by Tosoh Corp.) | | | |
| | vinyl acetate content (%) | 28 | 32 | 42 | 42 |
| | process of addition | add additives to toluene (15% by weight) solution of EVA | | dissolve homogeneously mixture of EVA with additives to toluene as EVA concentration becomes 20% by weight | |
| organic peroxide | kind | BBTMC*3 | benzoyl peroxide | | none |
| | amount of addition*1 | 0.5 | 4.0 | 2.0 | |
| photosensitizer | kind | | none | | benzoyl propyl ether |
| | amount of addition*1 | | | | 2.0 |
| silane coupling agent | kind | γ-methacryloxypropyltrimethoxysilane | | | |
| | amount of addition*1 | 0.5 | | | |
| epoxy-group containing compound | kind | glycidyl methacrylate | | | |
| | amount of addition*1 | 4.0 | | | |
| acryloyl group containing compound | kind | none | | | triallyl isocyanurate |
| | amount of addition*1 | | | | 2.0 |
| hydrocarbon resin | kind | none | | | ARKON P70*4 |
| | amount of addition*1 | | | | 5 |
| electrically conductive particles | kind | truly spherical copper particles manufactured by Fukuda Metal Foil & Power Industry | | truly spherical nickel particles manufactured by Fukuda Metal Foil & Power Industry | |
| | particle size | 3.8 μm | 7.6 μm | 5.0 μm | |
| | amount of addition*2 | 4 | | 2.4 | |
| properties immediately after adhesion | continuity resistance | 0.5 Ω or less | | 0.8 Ω or less | |
| | insulation resistance | $10^9$ Ω or more | | $10^{16}$ Ω or more | |
| | adhesive power (kg/inch) | 3.1 | 2.8 | 2.8 | 2.5 |
| measurement of changes with passage of time | continuity resistance | 10 Ω or less | 0.8 Ω or less | 1.0 Ω or less | 1.2 Ω or less |
| | insulation resistance | $10^9$ Ω or more | | $10^{14}$ Ω or more | |
| | adhesive power (kg/inch) | 3.1 | 2.8 | 3.0 | 2.8 |

*1 weight parts,
*2 % by volume
*3 1,1-bis(t-butylperoxy)-3,3,5-trimethylcyclohexane
*4 manufactured by Arakawa Industry Chemical
*5 Example 1, Ultrasen 710; Example 2, Ultrasen 750; Examples 3 and 4, Ultrasen 760

TABLE 2

| | | Example No. | | | |
|---|---|---|---|---|---|
| | | 5 | 6 | 7 | 8 |
| major component | kind | ethylene-vinyl acetate-glycidyl methacrylate copolymer*3 | ethylene-vinyl acetate-maleic anhydride copolymer*4 | ethylene-ethyl acrylate-maleic anhydride copolymer*5 | ionomer resin*6 |
| organic peroxide | kind | benzoyl peroxide | 1,1-bis(t-butylperoxy)-3,3,5-trimethylcyclohexane | | |
| | amount of*1 addition | | 2.0 | | |
| silane coupling agent | kind | γ-methacryloxypropyltrimethoxysilane | | | |
| | amount of*1 addition | 0.5 | | | |
| epoxy group containing compound | kind | glycidyl methacrylate | | | |
| | amount of*1 addition | 4.0 | | | |
| acryloyl group containing compound | kind | | triallyl isocyanurate | | |
| | amount of*1 addition | 2.0 | 1.0 | | |
| hydrocarbon resin | kind | ARKON P70 manufactured by Arakawa Industry Chemical | | | |
| | amount of*1 addition | 5 | | | |
| electrically conductive particles | kind | truly spherical nickel particles manufactured by Fukuda Metal Foil & Powder Industry | | | |
| | particle size | 10.0 μm | | | |
| | amount of*2 addition | 5.0 | | | |
| properties immediately after adhesion | continuity resistance | 0.8 Ω or less | 0.5 Ω or less | 0.6 Ω or less | 0.8 Ω or less |
| | insulation resistance | $10^{15}$ Ω or more | | | |
| | adhesive power (kg/inch) | 4.5 | 4.8 | 4.3 | 2.9 |
| measurement of changes with passage of time | continuity resistance | 1.0 Ω or less | 0.9 Ω or less | 0.8 Ω or less | 1.0 Ω or less |
| | insulation resistance | $10^{14}$ Ω or more | | | |
| | adhesive power (kg/inch) | 3.9 | 4.0 | 4.0 | 2.5 |

TABLE 2-continued

|  | Example No. | | | |
| --- | --- | --- | --- | --- |
|  | 5 | 6 | 7 | 8 |

*[1] weight parts,
*[2] % by volume
*[3] Bondfast 2A manufactured by Sumitomo Chemical Co. Ltd.
vinyl acetate content: 8% by weight
glycidyl methacrylate content: 3% by weight
*[4] MODIC E-100H manufactured by Mitsubishi Chemical Corp.
vinyl acetate content: about 20% by weight
maleic anhydride content: about 0.5% by weight
*[5] LX4110 manufactured by Sumitomo Chemical Co. Ltd.
ethylene content: 91% by weight
ethyl acrylate content: 8% by weight
maleic anhydride content: 1% by weight
*[6] ethylene-methacrylic acid-sodium ion ionomer resin
Himilane 1856 manufactured by Du Pont-Mitsui Polychemicals Co. Ltd.
methacrylic acid content: 5% by weight
degree of ionization by sodium ion: 40%

TABLE 3

|  |  | Example No. | | | |
| --- | --- | --- | --- | --- | --- |
|  |  | 9 | 10 | 11 | 12 |
| major component | kind | ethylene-vinyl acetate-glycidyl methacrylate copolymer*[3] | ethylene-vinyl acetate-maleic anhydride copolymer*[4] | ethylene-ethyl acrylate-maleic anhydride copolymer*[5] | ionomer resin*[6] |
| photosensitizer | kind | benzoyl propyl ether | | | |
|  | amount of*[1] addition | 2.0 | | | |
| silane coupling agent | kind | γ-methacryloxypropyltrimethoxysilane | | | |
|  | amount of*[1] addition | 0.5 | | | |
| epoxy group containing compound | kind | glycidyl methacrylate | | | |
|  | amount of*[1] addition | 4.0 | | | |
| acryloyl group containing compound | kind |  | triallyl isocyanurate | | |
|  | amount of*[1] addition | 2.0 |  |  | 1.0 |
| hydrocarbon resin | kind | ARKON P70 manufactured by Arakawa Industry Chemical | | | |
|  | amount of*[1] addition | 5 | | | |
| electrically conductive particles | kind | truly spherical nickel particles manufactured by Fukuda Metal Foil & Powder Industry | | | |
|  | particle size | 10.0 μm | | | |
|  | amount of*[2] addition | 5.0 | | | |
| properties immediately after adhesion | continuity resistance | 1.0 Ω or less | 0.7 Ω or less | 0.8 Ω or less | 1.0 Ω or less |
|  | insulation resistance | 10^15 Ω or more | | | |
|  | adhesive power (kg/inch) | 3.5 | 3.0 | 3.8 | 2.5 |
| measurement of changes with passage of time | continuity resistance | 1.2 Ω or less | 0.9 Ω or less | 1.0 Ω or less | 1.2 Ω or less |
|  | insulation resistance | 10^14 Ω or more | | | |
|  | adhesive power (kg/inch) | 3.8 | 3.1 | 3.4 | 2.2 |

*[1] weight parts,
*[2] % by volume
*[3] Bondfast 2A manufactured by Sumitomo Chemical Co. Ltd.
vinyl acetate content: 8% by weight
glycidyl methacrylate content: 3% by weight
*[4] MODIC E-100H manufactured by Mitsubishi Chemical Corp.
vinyl acetate content: about 20% by weight

TABLE 3-continued

|  | Example No. | | | |
| --- | --- | --- | --- | --- |
|  | 9 | 10 | 11 | 12 | maleic anhydride content: about 0.5% by weight
*[5] LX4110 manufactured by Sumitomo Chemical Co. Ltd.
ethylene content: 91% by weight
ethyl acrylate content: 8% by weight
maleic anhydride content: 1% by weight
*[6] ethylene-methacrylic acid-sodium ion ionomer resin
Himilane 1856 manufactured by Du Pont-Mitsui Polychemicals Co. Ltd.
methacrylic acid content: 5% by weight
degree of ionization by sodium ion: 40%

Any of the samples from Examples 1–12 could be very easily wiped off with acetone or toluene even after heat and pressure bonding.

What is claimed is:

1. An anisotropically electricity-conductive film comprising electrically conductive particles dispersed in an adhesive agent, said adhesive agent comprising a thermosetting adhesive agent including as a major component at least one polymer selected from the group consisting of an ethylene-vinyl acetate copolymer; a copolymer of ethylene, vinyl acetate and an acrylate and/or methacrylate monomer; a copolymer of ethylene, vinyl acetate and maleic acid and/or maleic anhydride; a copolymer of ethylene, one or both of an acrylate monomer and a methacrylate monomer, and one or both of maleic acid and maleic anhydride; and an ionomer resin wherein molecules of an ethylene-methacrylic acid copolymer are linked with each other through a metal ion; wherein said electrically conductive particles are contained in a ratio of from 0.1 to 15% by volume in relation to said polymer, and said electrically conductive particles have a particle size of from 0.1 to 100 μm, and further comprising 0.1–10 weight parts of an organic peroxide; 0.01–5 weight parts of a silane coupling agent; and 0.1–20 weight parts of an epoxy group containing compound in relation to 100 weight parts of said at least one polymer.

2. The anisotropically electricity-conductive film of claim 1, further comprising 0.1–50 weight parts of at least one compound selected from the group consisting of an acryloyl group containing compound, a methacryloyl group containing compound and an allyl group containing compound in relation to 100 weight parts of said polymer.

3. The anisotropically electricity-conductive film of claim 1, further comprising 1–200 weight parts of a hydrocarbon resin in relation to 100 weight parts of said polymer.

4. The anisotropically electricity-conductive film of claim 1, wherein said polymer is an ethylene-vinyl acetate copolymer of which the vinyl acetate content is 10–50% by weight.

5. The anisotropically electricity-conductive film of claim 1, wherein said polymer is a copolymer of ethylene, vinyl acetate and an acrylate and/or methacrylate monomer of which the vinyl acetate content is 10–50% by weight and the acrylate and/or methacrylate monomer content is 0.01–10% by weight.

6. The anisotropically electricity-conductive film of claim 1, wherein said polymer is a copolymer of ethylene, vinyl acetate and maleic acid and/or maleic anhydride of which the vinyl acetate content is 10–50% by weight and the maleic acid/or maleic anhydride content is 0.01–10% by weight.

7. The anisotropically electricity-conductive film of claim 1, wherein said polymer is a copolymer of ethylene, an acrylate and/or methacrylate monomer and maleic acid and/or maleic anhydride of which the acrylate monomer content is 10–50% by weight and the maleic acid/or maleic anhydride content is 0.01–10% by weight.

8. The anisotropically electricity-conductive film of claim 1, wherein said polymer is said ionomer resin of which the methacrylic acid content is 1–30% by weight and the degree of ionization by a metal ion is 5–80%.

9. An anisotropically electricity-conductive film comprising electrically conductive particles dispersed in an adhesive agent, said adhesive agent comprising a photo-setting adhesive agent including as a major component at least one polymer selected from the group consisting of an ethylene-vinyl acetate copolymer; a copolymer of ethylene, vinyl acetate and an acrylate and/or methacrylate monomer; a copolymer of ethylene, vinyl acetate and maleic acid and/or maleic anhydride; a copolymer of ethylene, one or both of an acrylate monomer and a methacrylate monomer, and one or both of maleic acid and maleic anhydride; and an ionomer resin wherein molecules of an ethylene-methacrylic acid copolymer are linked with each other through a metal ion; wherein said electrically conductive particles are contained in a ratio of from 0.1 to 15% by volume in relation to said polymer, and said electrically conductive particles have a particle size of from 0.1 to 100 μm, and further comprising 0.1–10 weight parts of a photosensitizer; 0.01–5 weight parts of a silane coupling agent; and 0.1–20 weight parts of an epoxy group containing compound in relation to 100 weight parts of said at least one polymer.

10. The anisotropically electricity-conductive film of claim 9, further comprising 0.1–50 weight parts of at least one compound selected from the group consisting of an acryloyl group containing compound, a methacryloyl group containing compound and an allyl group containing compound in relation to 100 weight parts of said polymer.

11. The anisotropically electricity-conductive film of claim 9, further comprising 1–200 weight parts of a hydrocarbon resin in relation to 100 weight parts of said polymer.

12. The anisotropically electricity-conductive film of claim 9, wherein said polymer is an ethylene-vinyl acetate copolymer of which the vinyl acetate content is 10–50% by weight.

13. The anisotropically electricity-conductive film of claim 9, wherein said polymer is a copolymer of ethylene, vinyl acetate and an acrylate and/or methacrylate monomer of which the vinyl acetate content is 10–50% by weight and the acrylate and/or methacrylate monomer content is 0.01–10% by weight.

14. The anisotropically electricity-conductive film of claim 9, wherein said polymer is a copolymer of ethylene, vinyl acetate and maleic acid and/or maleic anhydride of which the vinyl acetate content is 10–50% by weight and the maleic acid/or maleic anhydride content is 0.01–10% by weight.

15. The anisotropically electricity-conductive film of claim 9, wherein said polymer is a copolymer of ethylene, one or both of an acrylate monomer and a methacrylate monomer, and one or both of maleic acid and maleic anhydride and the acrylate monomer content is 10–50% by weight and the content of one or both of maleic acid and maleic anhydride is 0.01–10% by weight.

16. The anisotropically electricity-conductive film of claim 9, wherein said polymer is said ionomer resin of which the methacrylic acid content is 1–30% by weight and the degree of ionization by a metal ion is 5–80%.

* * * * *